US012704784B2

(12) United States Patent
Kim

(10) Patent No.: US 12,704,784 B2
(45) Date of Patent: Aug. 11, 2026

(54) SUBSTRATE PROCESSING APPARATUS AND SUBSTRATE PROCESSING METHOD

(71) Applicant: SEMES CO., LTD., Cheonan-si (KR)

(72) Inventor: Hyun Min Kim, Cheonan-si (KR)

(73) Assignee: Hyun Min Kim, Cheonan-si (KR)

( * ) Notice: Subject to any disclaimer, the term of this patent is extended or adjusted under 35 U.S.C. 154(b) by 37 days.

(21) Appl. No.: 18/523,881

(22) Filed: Nov. 30, 2023

(65) Prior Publication Data

US 2024/0184208 A1 Jun. 6, 2024

(30) Foreign Application Priority Data

Dec. 1, 2022 (KR) ........................ 10-2022-0165524

(51) Int. Cl.
*G03F 7/16* (2006.01)
*H10P 72/00* (2026.01)

(52) U.S. Cl.
CPC ............ *G03F 7/16* (2013.01); *H10P 72/0402* (2026.01)

(58) Field of Classification Search
CPC ... C23C 16/448–4487; C23C 16/45561; G03F 7/16; H01J 37/3244–32449; H01L 21/67017; H10P 72/0402
See application file for complete search history.

(56) References Cited

U.S. PATENT DOCUMENTS 5,401,316 A * 3/1995 Shiraishi ........... H01L 21/67103 118/728
2006/0110930 A1* 5/2006 Senzaki ............ H01L 21/28562 438/758
2021/0129175 A1* 5/2021 Bang ................. H01L 21/67103
2023/0257878 A1* 8/2023 Chandrasekharan ........................ C23C 16/4482 427/248.1

FOREIGN PATENT DOCUMENTS

KR 10-0244439 5/1994
KR 10-2007-0013728 1/2007
KR 10-1692082 12/2011
KR 10-2015-0124871 11/2015
KR 10-2343638 6/2020

OTHER PUBLICATIONS

Office Action from the Korean Intellectual Property Office dated Mar. 25, 2024.

* cited by examiner

*Primary Examiner* — Benjamin Kendall

(57) ABSTRACT

Proposed is a substrate processing apparatus and a substrate processing method. The substrate processing apparatus includes a process chamber configured to have a processing space therein, a support unit configured to support a substrate within the processing space, a gas supply unit configured to supply a processing gas to the processing space, and an exhaust unit configured to exhaust the processing space, wherein the gas supply unit may vaporize a processing fluid in a liquid state by using at least one of a bubbling method and a blowing method and supply the processing fluid to the processing space.

13 Claims, 11 Drawing Sheets

SUBSTRATE PROCESSING APPARATUS AND SUBSTRATE PROCESSING METHOD

CROSS REFERENCE TO RELATED APPLICATION

The present application claims priority to Korean Patent Application No. 10-2022-0165524, filed on Dec. 1, 2022, the entire contents of which is incorporated by reference herein for all purposes.

BACKGROUND OF THE INVENTION

1. Field of the Invention

The present disclosure relates to a substrate processing apparatus and a substrate processing method.

2. Description of the Related Art

In order to manufacture semiconductor devices, various processes such as cleaning, deposition, photo, etching, and ion implantation are performed. Among them, the photo (photolithography) process, which is a process of forming a desired pattern on a substrate, may include: coating for forming a film by applying a photoresist on the surface of a substrate; exposure for transferring a circuit pattern to the film formed on the substrate; and development for selectively removing the film formed on the substrate from an exposed area or the opposite area.

Generally, in the coating process of forming a coating film on a substrate, before forming the coating film, hydrophobic treatment is performed to improve the adhesion between the substrate surface and a photoresist or between a thin film on the substrate and the photoresist. For example, since photoresist is an organic compound, it does not adhere well to an oxide film and the like, and thus undercuts may occur during an etching process performed after a photo process. Accordingly, a process of hydrophobizing the substrate may be performed before applying the photoresist to increase the adhesion efficiency of the coating film.

The hydrophobic treatment may be performed by supplying hexamethyldisilane (hereinafter referred to as "HMDS") gas into a processing space while heating the substrate. The HMDS gas may be obtained by vaporizing HMDS liquid, and in general, for vaporizing a chemical solution, a bubbling method in which a bubbler is installed at the bottom of a container where a chemical solution is stored to supply carrier gas into the chemical solution, or a blowing method to supply carrier gas from the top of a container where a chemical solution is stored to the inside of the container is used.

SUMMARY OF THE INVENTION

Accordingly, the present disclosure has been made keeping in mind the above problems occurring in the related art, and the present disclosure is intended to provide a substrate processing apparatus and a substrate processing method, enabling selection of a method of vaporizing a chemical solution to supply a processing gas to a substrate.

In addition, an objective of the present disclosure is to provide a substrate processing apparatus and a substrate processing method for more precisely controlling and stably supplying the processing gas supply amount.

In addition, an objective of the present disclosure is to provide a substrate processing apparatus and a substrate processing method for preventing waste of a chemical solution due to leakage of the chemical solution.

Objectives of the present disclosure are not limited thereto, and other objectives not mentioned will be clearly understood by those skilled in the art from the following description.

In order to achieve the above objective, according to an embodiment of the present disclosure, there is provided a substrate processing apparatus including: a process chamber configured to have a processing space therein; a support unit configured to support a substrate within the processing space; a gas supply unit configured to supply a processing gas to the processing space; and an exhaust unit configured to exhaust the processing space, wherein the gas supply unit may vaporize a processing fluid in a liquid state by using at least one of a bubbling method and a blowing method and supply the processing fluid to the processing space.

According to an embodiment of the present disclosure, there is provided a substrate processing method, in which a substrate may be treated by supplying a processing gas to improve an adhesion of a photoresist to a processing space provided with the substrate before coating the photoresist on the substrate, wherein a gas supply unit supplying the processing gas may selectively use at least one of a bubbling method and a blowing method to vaporize a processing fluid in a liquid state into the processing gas.

According to an embodiment of the present disclosure, there is provided substrate processing equipment including: an index module where a substrate flows in or out; and a treating module configured to include a substrate processing apparatus performing a thermal process on the substrate, wherein the substrate processing apparatus may include: a process chamber configured to have a processing space therein; a support unit configured to support a substrate within the processing space and to include a heating member; a gas supply unit configured to supply a processing gas to the processing space; and an exhaust unit configured to exhaust the treat space, wherein the gas supply unit may vaporize a processing fluid in a liquid state by using at least one of a bubbling method and a blowing method and supply the processing fluid to the processing space. That is, the gas supply unit may include both a bubbler and a blower, and the blower may serve as a shield to prevent liquid splashing.

According to embodiments of the present disclosure, it is possible to stably supply the correct amount of a processing gas to a substrate by selectively applying at least one of a bubbling method and a blowing method when vaporizing a chemical solution to supply the processing gas to the substrate.

Furthermore, according to the embodiments of the present disclosure, it is possible to prevent a chemical solution from flowing into a gas supply line or flowing out of a storage container by a blowing device since a bubbling device and the blowing device are provided together in the storage container.

Furthermore, according to the embodiments of the present disclosure, it is possible to efficiently perform a process of treating a substrate by supplying a gas thereto.

The effects of the present disclosure are not limited to the above effects, and effects not mentioned will be clearly understood by those skilled in the art from this specification and the accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 4 is a view showing an example of a hand provided in a transport chamber of FIG. 3;

FIG. 9 is a perspective view schematically showing gas supply unit provided in the substrate processing apparatus of FIG. 7; and FIGS. 10 and 11 are flowcharts showing a substrate processing method according to an embodiment of the present disclosure.

DETAILED DESCRIPTION OF THE INVENTION

Figure 1:
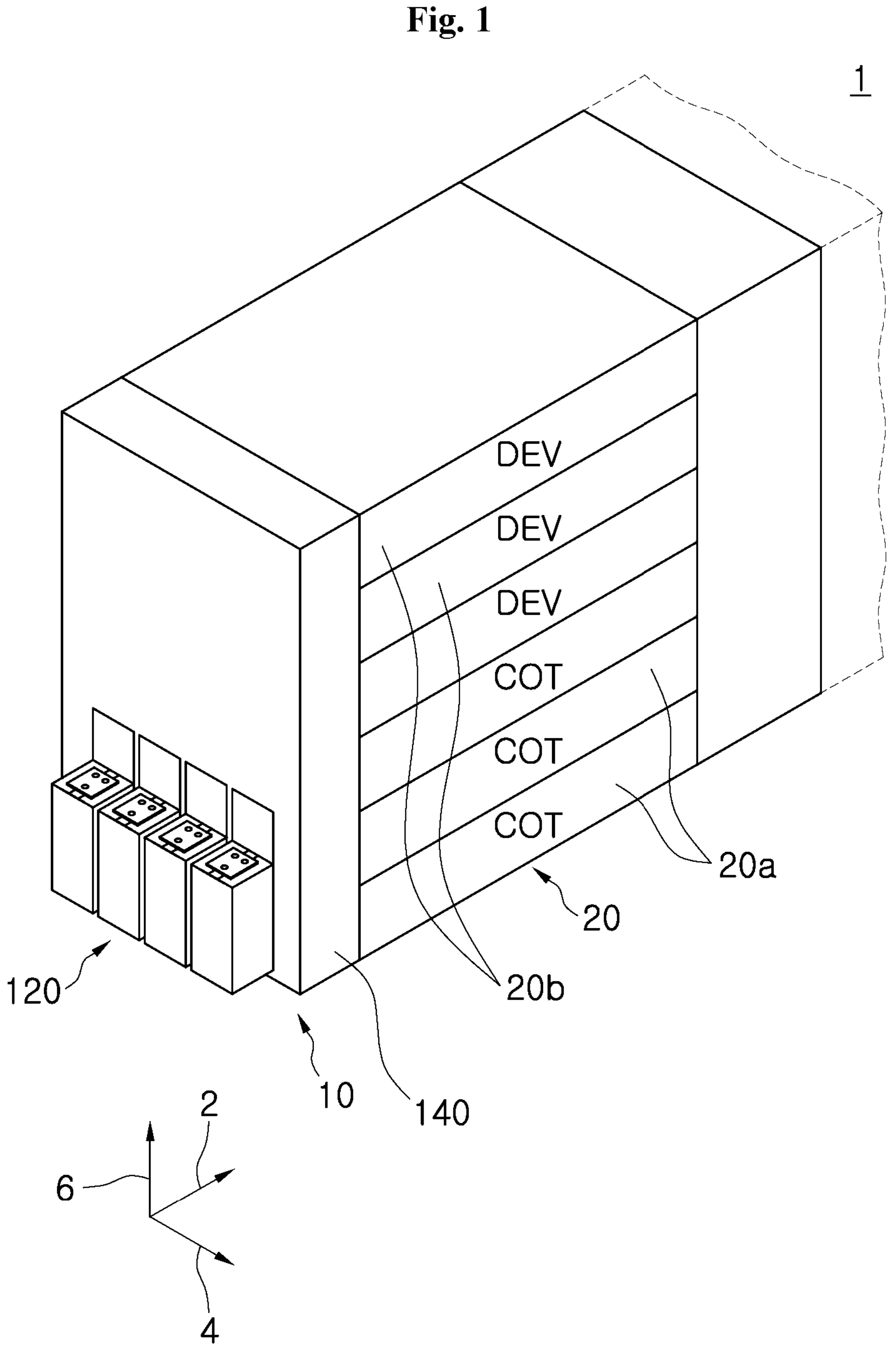
FIG. 1 is a perspective view schematically showing a substrate processing equipment according to an embodiment of the present disclosure.

Hereinafter, embodiments of the present disclosure will be described in detail with reference to the accompanying drawings. The embodiments of the present disclosure may be modified in various forms, and the scope of the present disclosure should not be construed as being limited due to the embodiments described below. These embodiments are provided to more completely explain the present disclosure to those skilled in the art. Therefore, the shapes of components in the drawings are exaggerated to emphasize a clearer explanation.

Hereinafter, an embodiment of the present disclosure will be described in detail with reference to FIGS. 1 to 11. In the following embodiment, as a substrate processing apparatus, an apparatus for applying a photoresist on a substrate and performing a process of developing the substrate after exposure will be described as an example. However, the present disclosure is not limited thereto, and may be applied to various types of devices for treating a substrate by supplying a liquid to a rotating substrate. For example, the substrate processing apparatus may be a device that performs a process of supplying a cleaning solution to a substrate to remove foreign substances on the substrate or supplying a chemical solution to the substrate to remove a thin film from the substrate.

Figure 2:
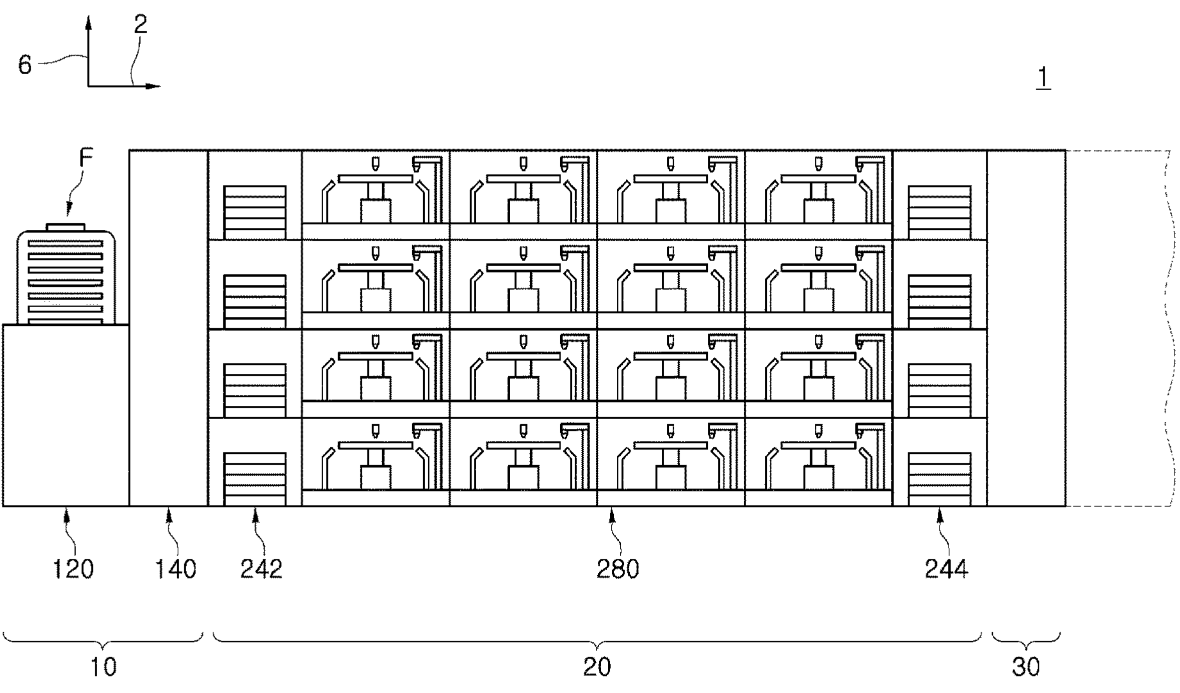
FIG. 2 is a cross-sectional view of the substrate processing equipment showing a coating block or developing block of FIG. 1.

FIG. 1 is a perspective view schematically showing a substrate processing equipment according to an embodiment of the present disclosure; FIG. 2 is a cross-sectional view of the substrate processing equipment showing a coating block or development block of FIG. 1; and FIG. 3 is a plan view of the substrate processing equipment of FIG. 1.

Figure 3:
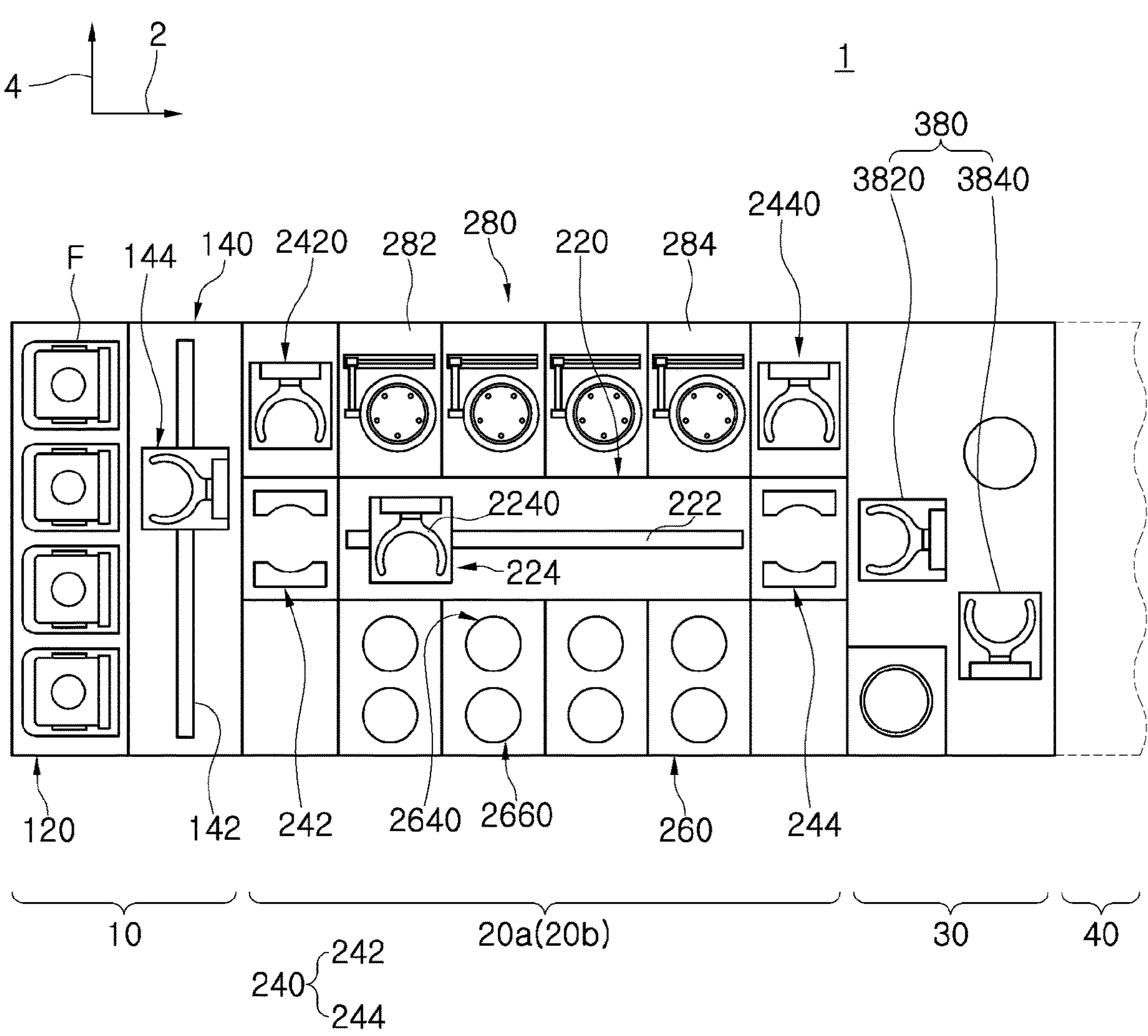
FIG. 3 is a plan view of the substrate processing equipment of FIG. 1.

Referring to FIGS. 1 to 3, a substrate processing equipment 1 includes: an index module 10, a treating module 20, and an interface module 30. According to an embodiment, the index module 10, the treating module 20, and the interface module 30 are sequentially arranged in a line. Hereinafter, a direction in which the index module 10, the treating module 20, and the interface module 30 are arranged is defined as a first direction 2, a direction perpendicular to the first direction 2 is defined as a second direction 4 when viewed from above, and a direction perpendicular to the plane including both the first direction 2 and the second direction 4 is defined as a third direction 6.

The index module 10 transfers a substrate W from a container F in which the substrate W is stored to the treating module 20 that treats the substrate W. The index module 10 stores the substrate W, which has been treated in the treating module 20, into the container F. The longitudinal direction of the index module 10 is provided as the second direction 4. The index module 10 has a load port 120 and an index frame 140.

The container F containing the substrate W is seated in the load port 120. The load port 120 is located on the opposite side of the treating module 20 with respect to the index frame 140. A plurality of load ports 120 may be provided, and the plurality of load ports 120 may be arranged in a line along the second direction 4. The number of load ports 120 may increase or decrease depending on process efficiency and footprint conditions of the treating module 20.

The container F is formed with a plurality of slots (not shown) for accommodating substrates W in a state in which the substrates W are arranged horizontally with respect to the ground. As the container F, an airtight container such as a front opening unified pod (FOUP) may be used. The container F may be placed in the load port 120 by a transport means (not shown) such as an overhead transfer, overhead conveyor, or automatic guided vehicle or by an operator.

Inside the index frame 140, an index rail 142 and an index robot 144 are provided. The index rail 142 is provided in the index frame 140 with its longitudinal direction along the second direction 4. The index robot 144 may transport the substrates W. The index robot 144 may transport the substrates W between the index module 10 and a buffer chamber 240 to be described later. The index robot 144 may include an index hand 1440. The substrate W may be placed on the index hand 1440. The index hand 1440 may include an index base 1442 having an annular ring shape in which a part of the circumference thereof is symmetrically bent, and an index support 1444 for moving the index base 1442. The configuration of the index hand 1440 is the same as or similar to that of a transport hand 2240 described later. The index hand 1440 may be provided to be movable along the second direction 4 on the index rail 142. Accordingly, the index hand 1440 may move forward and backward along the index rail 142. In addition, the index hand 1440 may be provided to be rotatable about an axis parallel to the third direction 6 and movable along the third direction 6.

The treating module 20 receives the substrate W stored in the container F and performs a coating process and a developing process on the substrate W. The treating module 20 has a coating block **20*a* and a developing block 20*b*. The coating block 20*a* performs a coating process on the substrate, and the developing block 20*b* performs a developing process on the substrate. A plurality of coating blocks 20*a* are provided, and the coating blocks 20*a* are provided stacked on top of each other. A plurality of developing blocks 20*b* are provided, and the developing blocks 20*b* are provided stacked on top of each other. According to the embodiment of FIG. 1, two coating blocks 20*a* are provided and two developing blocks 20*b* are provided. The coating blocks 20*a* may be disposed below the developing blocks 20*b*. As an example, the two coating blocks 20*a* may perform the same process and be provided with the same structure. In addition, the two developing blocks 20*b*** may perform the same process and be provided with the same structure.

Referring to FIG. 3, the coating block **20*a* has a transport chamber 220, a buffer chamber 240, a heat treating chamber 260, and a liquid treating chamber 280. The transport chamber 220 provides a space for transporting the substrates W between the buffer chamber 240 and the heat treating chamber 260, between the buffer chamber 240 and the liquid treating chamber 280, and between the heat treating chamber 260 and the liquid treating chamber 280. The buffer chamber 240 provides a space in which the substrates W carried into the coating block 20*a* and the substrates W exported from the coating block 20*a* temporarily stay. The heat treating chamber 260 performs a thermal process on the substrate. The thermal process may include a cooling process and a heating process. The liquid treating chamber 280** supplies liquid to the substrate W to form a liquid film. The liquid film may be a photoresist film or an antireflection film.

The transport chamber 220 may be provided in the first direction 2 in its longitudinal direction. A guide rail 222 and a transport robot 224 are provided in the transport chamber 220. The guide rail 222 is provided in the transport chamber 220 with its longitudinal direction in the first direction 2. The transport robot 224 may be provided to be linearly movable along the first direction 2 on the guide rail 222. The transport robot 224 transports the substrates W between the buffer chamber 240 and the heat treating chamber 260, between the buffer chamber 240 and the liquid treating chamber 280, and between the heat treating chamber 260 and the liquid treating chamber 280.

As an example, the transport robot 224 has a transport hand 2240 on which a substrate W is placed. The transport hand 2240 may move forward and backward, rotate about an axis parallel to the third direction 6, and move along the third direction 6.

Figure 4:
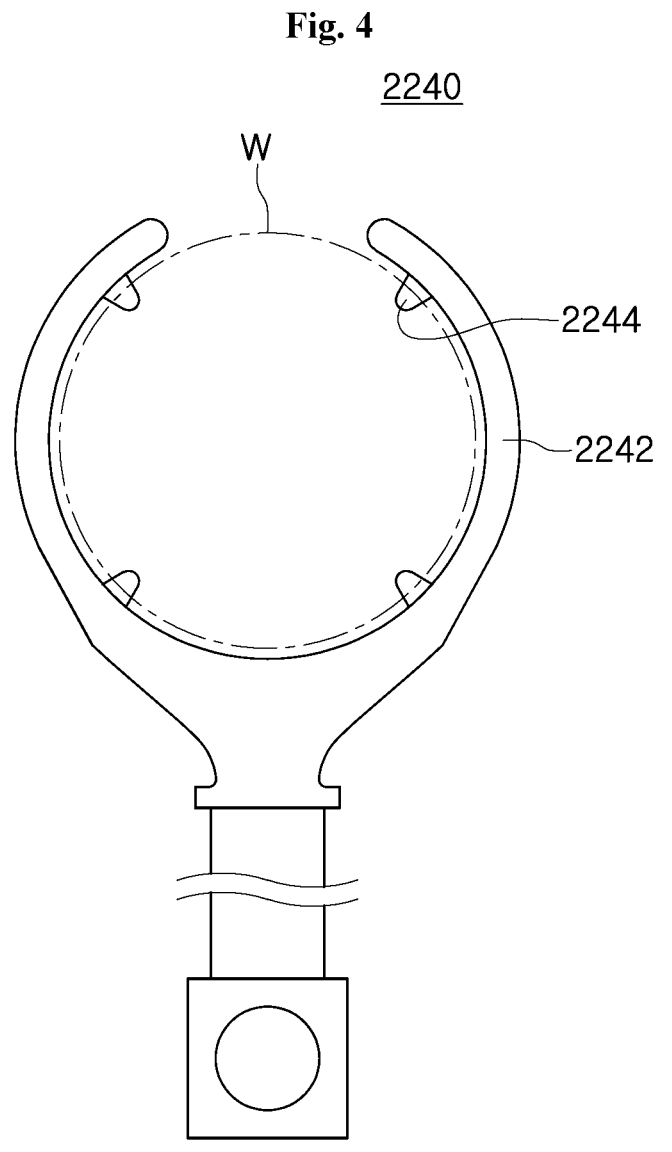

FIG. 4 is a view showing an example of a transport hand provided in a transport chamber of FIG. 3. Referring to FIG. 4, a transport hand 2240 has a base 2242 and a support protrusion 2244. The base 2242 may have an annular ring shape in which a part of the circumference thereof is bent. The base 2242 may have a ring shape in which a part of the circumference thereof is symmetrically bent. The base 2242 has an inner diameter larger than the diameter of the substrate W. The support protrusion 2244 extends inwardly from base 2242. A plurality of support protrusions 2244 are provided and support the edge area of a substrate W. As an example, four support protrusions 2244 may be provided at equal intervals.

Referring back to FIGS. 2 and 3, a plurality of buffer chambers 240 are provided. Some of the buffer chambers 240 are disposed between the index module 10 and the transport chamber 220. Hereinafter, these buffer chambers are defined as a front buffer 242. The front buffer 242 is provided in plurality, and may be positioned to be stacked on each other along the vertical direction. The other buffer chambers 240 are disposed between the transport chamber 220 and the interface module 30. Hereinafter, these buffer chambers are defined as a rear buffer 244. The rear buffer 244 is provided in plurality, and may be positioned to be stacked on each other along the vertical direction. Each of the front buffers 242 and the rear buffers 244 temporarily stores a plurality of substrates W. The substrates W stored in the front buffer 242 are carried in or out by the index robot 144 and the transport robot 224. The substrates W stored in the rear buffer 244 are carried in or out by the transport robot 224 and a first robot 3820 to be described later.

Buffer robots 2420 and 2440 may be provided on one side of the buffer chamber 240. The buffer robots 2420 and 2440 may include a front buffer robot 2420 and a rear buffer robot 2440. The front buffer robot 2420 may be provided on one side of the front buffer 242, and the rear buffer robot 2440 may be provided on one side of the rear buffer 244, but is not limited thereto, and the buffer robots 2420 and 2440 may be provided on both sides of the buffer chamber 240.

The front buffer robot 2420 may transport the substrates W between the front buffers 242.

The front buffer robot 2420 may include a front buffer hand. The front buffer hand may move up and down along the third direction 6. The front buffer hand may be rotated. The front buffer hand may transport the substrate W.

The rear buffer robot 2440 may transport the substrates W between the rear buffers 244. The rear buffer robot 2440 may include a rear buffer hand. The configuration of the rear buffer hand is the same as or similar to that of the front buffer hand. Therefore, the description of the rear buffer hand is omitted.

A plurality of liquid treating chambers 280 are provided. Some of the liquid treating chambers 280 may be provided to be stacked on top of each other. The liquid treating chambers 280 are disposed on one side of the transport chamber 220. The liquid treating chambers 280 are arranged side by side along the first direction 2. Some of the liquid treating chambers 280 are provided adjacent to the index module 10. Hereinafter, the liquid treating chambers 280 are defined as a front liquid treating chamber 282. The other liquid treating chambers 280 are provided adjacent to the interface module 30. Hereinafter, the liquid treating chambers 280 are defined as rear liquid treating chambers 284.

The front liquid treating chamber 282 applies a first liquid on a substrate W, and the rear liquid treating chamber 284 applies a second liquid on a substrate W. The first liquid and the second liquid may be different types of liquids. According to an embodiment, the first liquid is an antireflection film, and the second liquid is a photoresist. The photoresist may be applied on the substrate W coated with the antireflection film.

Alternatively, the first liquid is a photoresist and the second liquid is an antireflection film. In this case, the antireflection film may be applied on the substrate W coated with the photoresist. Alternatively, the first liquid and the second liquid are the same kind of liquid, and they may both be photoresists.

Figure 5:
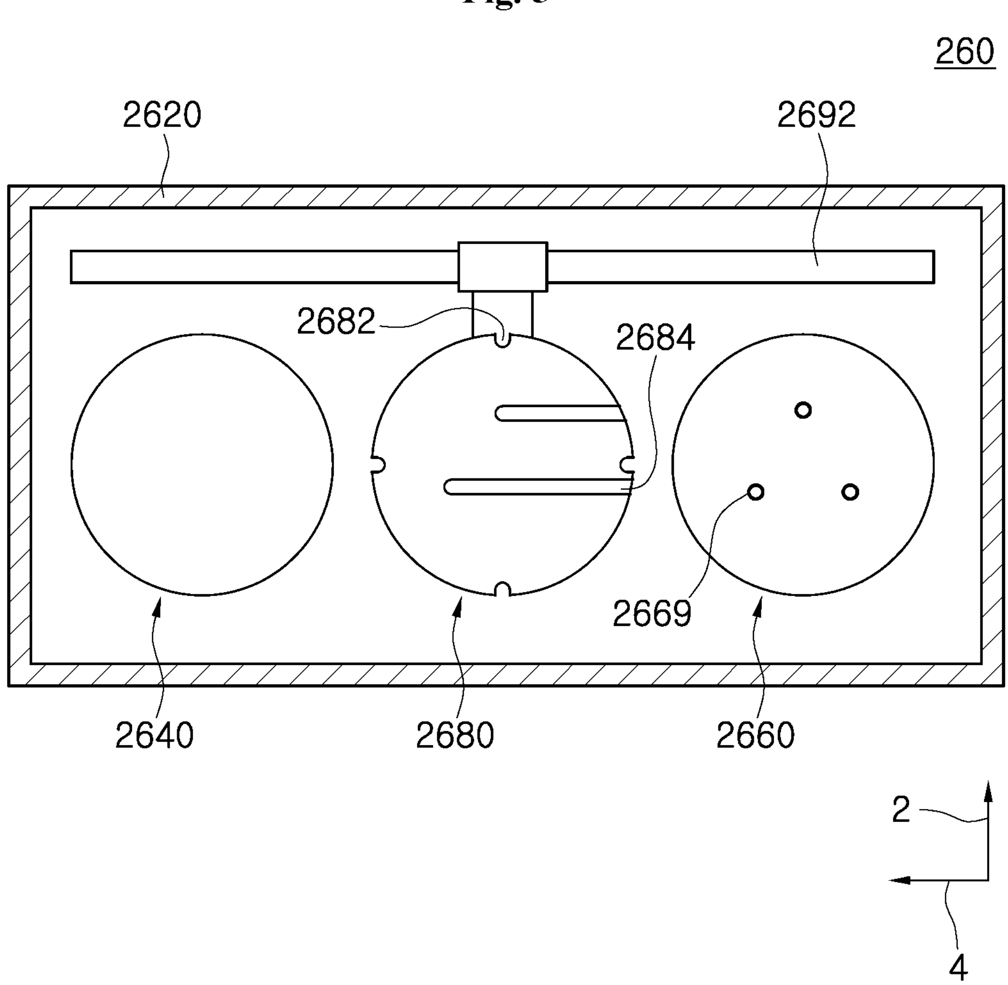
FIG. 5 is a schematic cross-sectional plan view showing an example of a heat treating chamber of FIG. 3.
Figure 6:
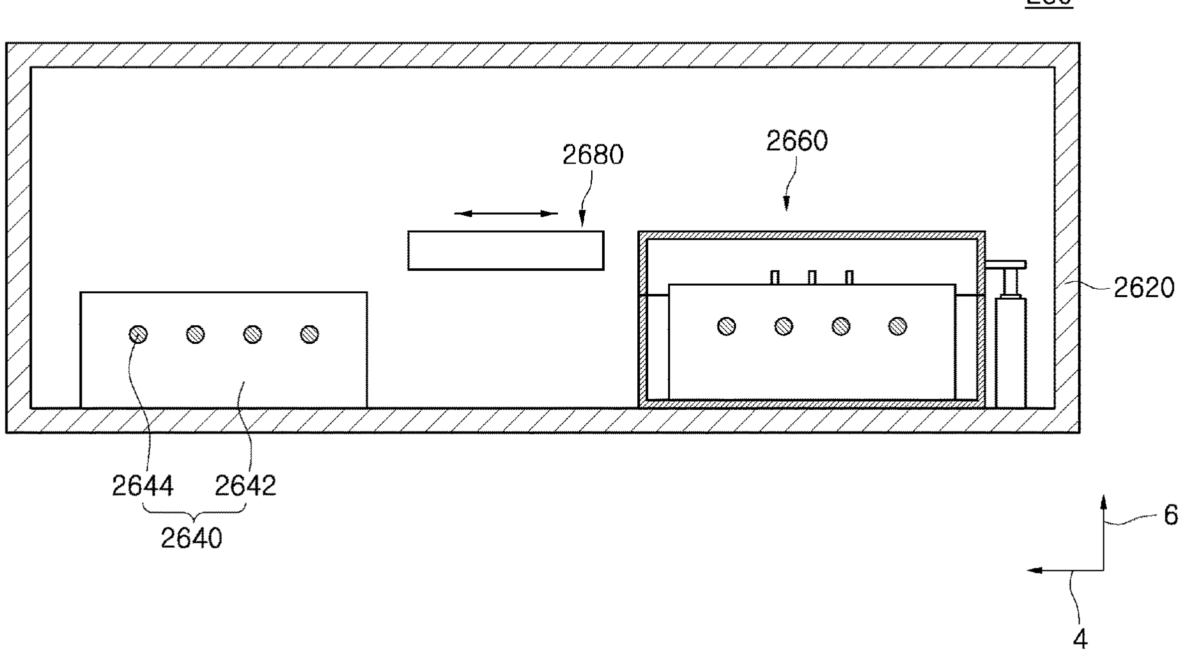
FIG. 6 is a front cross-sectional view of the heat treating chamber of FIG. 5.

FIG. 5 is a schematic cross-sectional plan view showing an example of a heat treating chamber of FIG. 3; and FIG. 6 is a front cross-sectional view of the heat treating chamber of FIG. 5. Referring to FIGS. 5 and 6, a plurality of heat treating chambers 260 may be provided. The heat treating chambers 260 are disposed along the first direction 2. The heat treating chambers 260 are located on one side of the transport chamber 220. The heat treating chamber 260 may include a housing 2620, a cooling unit 2640, a heating unit 2660, and a transport plate 2680.

The housing 2620 is generally provided in the shape of a rectangular parallelepiped. The housing 2620 provides space therein. An entrance (not shown) through which a substrate W is in and out is provided on the sidewall of the housing 2620. The entrance may remain open. A door (not shown) may be provided to selectively open and close the entrance.

The cooling unit 2640, the heating unit 2660, and the transport plate 2680 may be provided inside the housing 2620. The cooling unit 2640 and the heating unit 2660 are provided side by side along the second direction 4. As an example, the cooling unit 2640 may be located relatively closer to the transport chamber 220 than the heating unit 2660.

The cooling unit 2640 includes a cooling plate 2642. The cooling plate 2642 may have a generally circular shape when viewed from the top. A cooling member 2644 is provided on the cooling plate 2642. As an example, the cooling member 2644 is provided inside the cooling plate 2642 and may be provided as a passage through which cooling fluid flows.

The transport plate 2680 is generally provided in a disc shape and has a diameter corresponding to that of a substrate W. A notch 2682 is formed at the edge of the transport plate 2680. The notch 2682 is provided in a number corresponding to the support protrusion 2244 formed on the transport hand 2240 of the transport robot 224, and is formed at a position corresponding to the support protrusion 2244. When the vertical position of the transport hand 2240 and the transport plate 2680 is changed at the position where the transport hand 2240 and the transport plate 2680 are vertically aligned, a substrate W is transferred between the transport hand 2240 and the transport plate 2680. The transport plate 2680 is mounted on a guide rail 2692 and may be moved between a first area 2696 and a second area 2698 along the guide rail 2692 by an actuator 2694.

The transport plate 2680 is provided with a plurality of slit-shaped guide grooves 2684.

The guide grooves 2684 extend from the end of the transport plate 2680 to the inside of the transport plate 2680. The guide grooves 2684 are provided along the second direction 4 in their longitudinal direction, and the guide grooves 2684 are spaced apart from each other along the first direction 2. The guide grooves 2684 prevent the transport plate 2680 and lift pins 2735 from interfering with each other when the transfer of the substrates W is performed between the transport plate 2680 and the heating unit 2660.

The heating unit 2660 provided in some of the heat treating chambers 260 may improve the adhesion rate of a photoresist to the substrate W by supplying gas while heating the substrate W. As an example, a gas supplied while heating the substrate W may be hexamethyldisilane (hereinafter referred to as "HMDS"). Hereinafter, among the heating units 2660 provided in the heat treating chamber 260, a device for supplying a gas for improving the adhesion of the photoresist to the substrate will be described as an example.

Figure 7:
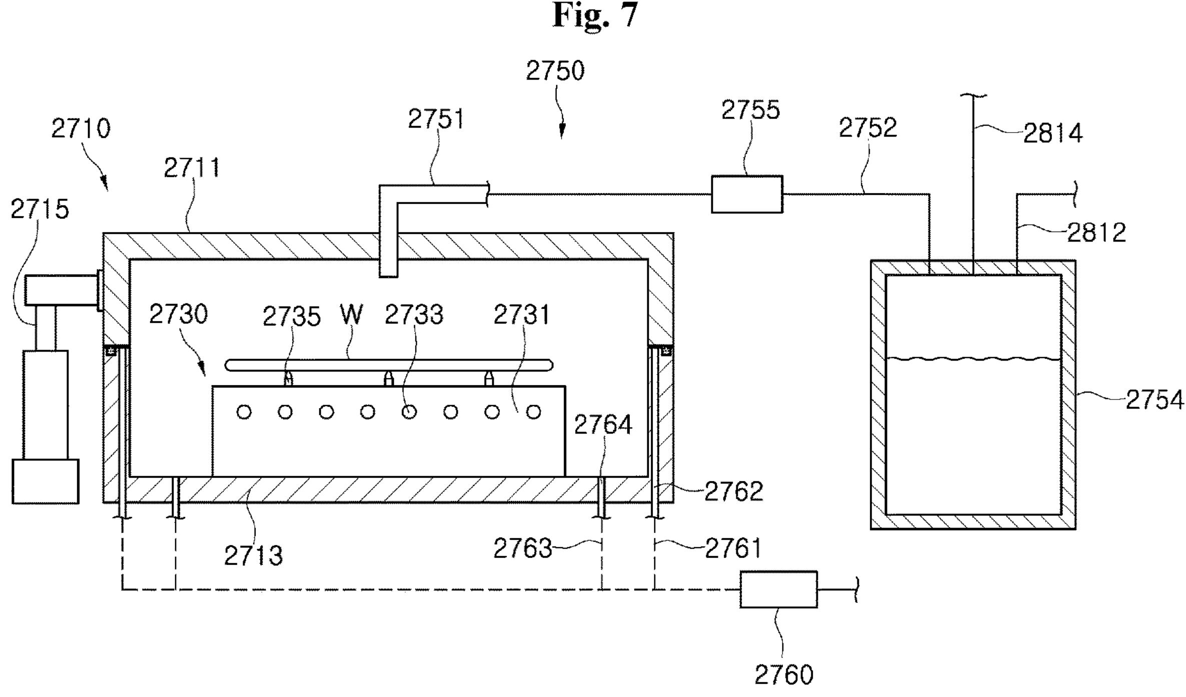
FIG. 7 is a cross-sectional view showing the substrate processing apparatus provided in a heating unit of FIG. 6.
Figure 8:
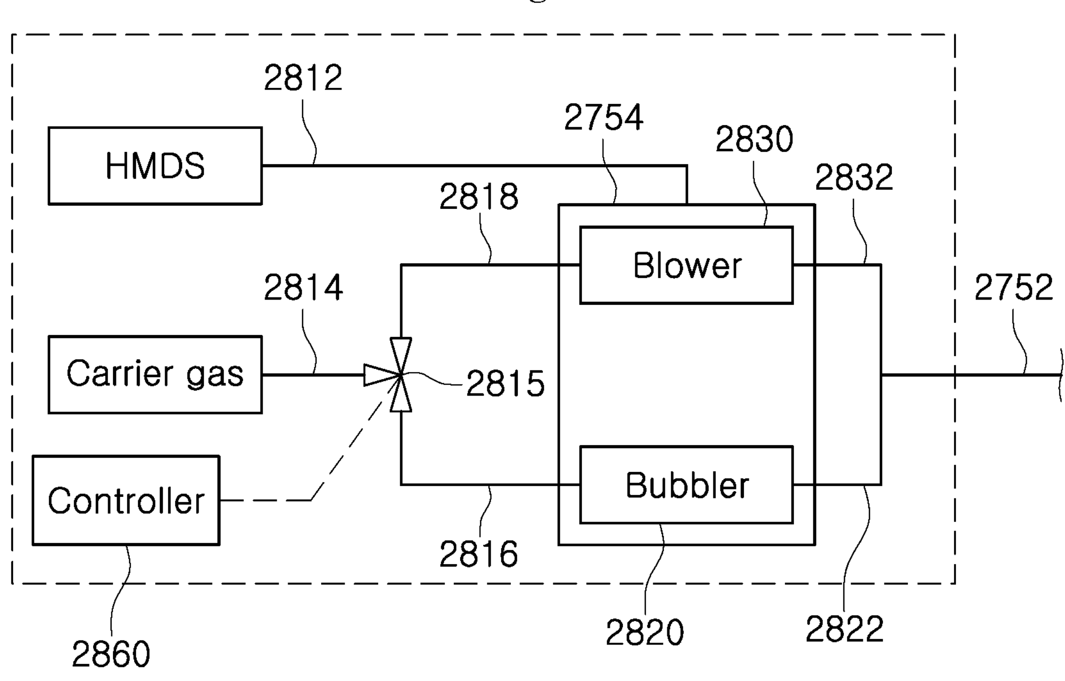
FIG. 8 is a schematic configuration diagram showing a gas supply unit provided in the substrate processing apparatus of FIG. 7.
Figure 9:
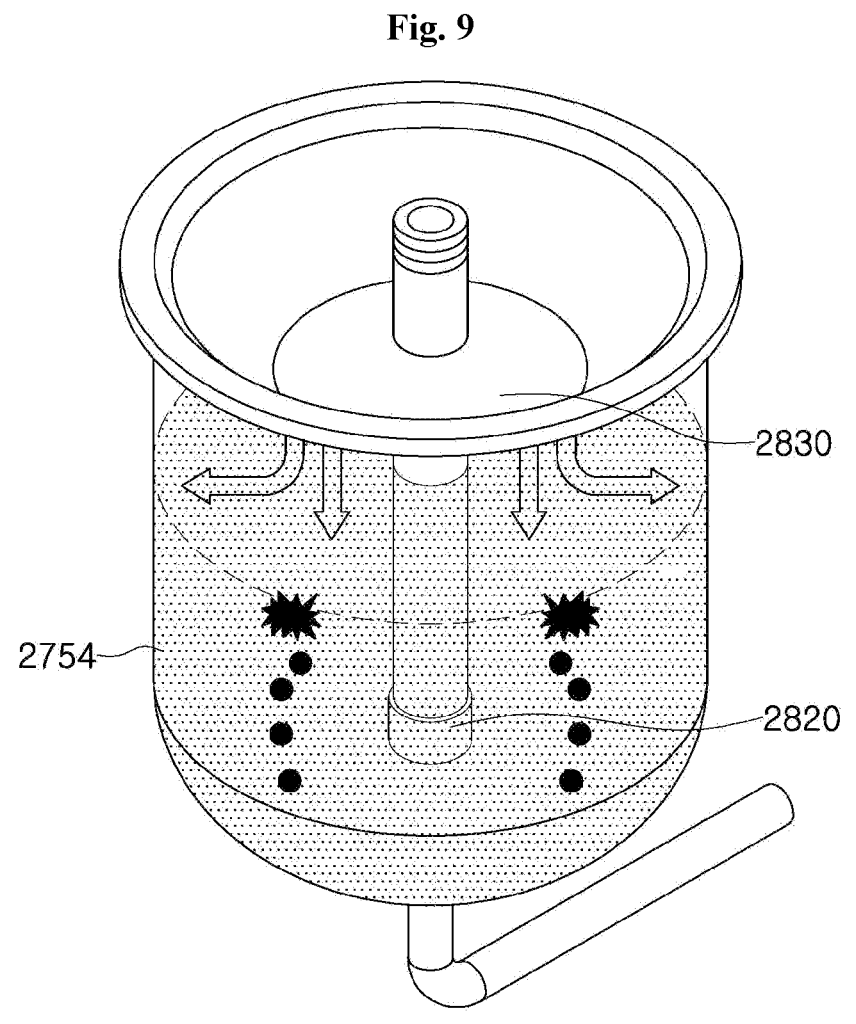

FIG. 7 is a cross-sectional view showing the substrate processing apparatus provided in the heating unit 2660 of FIG. 6; FIG. 8 is a schematic configuration diagram showing a gas supply unit provided in the substrate processing apparatus of FIG. 7; and FIG. 9 is a perspective view schematically showing gas supply unit provided in the substrate processing apparatus of FIG. 7.

The substrate processing apparatus provided in the heating unit 2660 may treat a substrate. To be specific, the substrate processing apparatus provided in the heating unit 2660 may hydrophobize a substrate with HMDS gas before a photoresist is applied.

Referring to FIG. 7, the substrate processing apparatus provided in the heating unit 2660 includes a process chamber 2710, a support unit 2730, a gas supply unit 2750, and an exhaust unit 2760.

The process chamber 2710 provides a processing space therein. As an example, the process chamber 2710 may be provided in a cylindrical shape. Alternatively, the process chamber 2710 may be provided in a rectangular parallelepiped shape. The process chamber 2710 may include an upper chamber 2711 and a lower chamber 2713. The upper chamber 2711 and the lower chamber 2713 may be combined with each other to form a processing space therein.

When viewed from above, the upper chamber 2711 may be provided in a circular shape. The lower chamber 2713 is located below the upper chamber 2711 and may have a circular shape when viewed from above.

An actuator 2715 may be coupled with the upper chamber 2711. The actuator 2715 may move the upper chamber 2711 up and down. The actuator 2715 may open the inside of the process chamber 2710 by moving the upper chamber 2711 upward when a substrate W is loaded into the process chamber 2710. The actuator 2715 may contact the upper chamber 2711 with the lower chamber 2713 to seal the inside of the process chamber 2710 when performing a treating process on the substrate W. In the embodiment, although the actuator 2715 is connected to the upper chamber 2711 and provided as an example, the actuator 2715 may be connected to the lower chamber 2713 to move the lower chamber 2713 up and down.

Meanwhile, the processing space may be sealed from the outside by installing a sealing member on the contact surface between the upper chamber 2711 and the lower chamber 2713. As an example, the sealing member may be installed on the contact surface of the lower chamber 2713.

The support unit 2730 may support the substrate W. The support unit 2730 may be provided in the processing space to support the substrate W. The support unit 2730 may have a circular shape when viewed from above. An upper surface of the support unit 2730 may have a larger cross-sectional area than the substrate W. The support unit 2730 may be made of a material with good thermal conductivity. The support unit 2730 may be made of a material having excellent heat resistance.

The support unit 2730 may include a heating plate 2731, a heating member 2733, and a lift pin 2735.

The heating plate 2731 is a plate on which the substrate W is seated and has a substantially circular shape when viewed from above. The heating plate 2731 may have a larger diameter than the substrate W. The heating member 2733 is installed on the heating plate 2731.

For example, the heating member 2733 may be located inside the heating plate 2731. The heating member 2733 may be provided as a heating resistor to which current is applied. As an example, the heating member 2733 may be provided as a heater. A plurality of heaters may be provided inside the heating plate 2731.

The exhaust unit 2760 may exhaust the processing space. The exhaust unit 2760 may include an upper exhaust line 2761, a lower exhaust line 2763, and a pressure reducing member.

The upper exhaust line 2761 may exhaust the processing space. The upper exhaust line 2761 may be provided on the side wall of the processing space. Accordingly, the upper exhaust line 2761 may exhaust the inside of the processing space in a lateral direction. The upper exhaust line 2761 may exhaust the processing space at a position higher than the lower exhaust line 2763. The upper exhaust line 2761 may exhaust the processing space at a location around the upper surface of the support unit 2730. For example, the upper exhaust line 2761 may exhaust the processing space at a position equal to or higher than the upper surface of the support unit 2730. The upper exhaust line 2761 may be connected to an upper exhaust hole 2762. As an example, the upper exhaust hole 2762 may be provided in an area where the upper chamber 2711 and the lower chamber 2713 come into contact. The upper exhaust hole 2762 may be provided in the upper chamber 2711 in a ring shape. Alternatively, the upper exhaust hole 2762 may be provided as a plurality of holes. The upper exhaust line 2761 may be connected to the upper exhaust hole 2762 to exhaust the processing space. The upper exhaust line 2761 may be provided in a number corresponding to the number of upper exhaust holes 2762.

The lower exhaust line 2763 may exhaust the processing space. The lower exhaust line 2763 may be provided on the lower wall of the process chamber 2710. Accordingly, the lower exhaust line 2763 may exhaust the inside of the processing space in a downward direction. The lower exhaust line 2763 may exhaust the inside of the processing space at a position lower than the upper exhaust line 27611. As an example, the lower exhaust line 2763 may exhaust the processing space at a position lower than the substrate W supported by the support unit 2730. The lower exhaust line 2763 may be connected to a lower exhaust hole 2764. The lower exhaust hole 2764 may be formed in the lower chamber 2713. The lower exhaust hole 2764 may be located in the processing space. The lower exhaust hole 2764 may be located outside the support unit 2730. A plurality of lower exhaust holes 2764 may be provided. The lower exhaust line 2763 may be provided in a number corresponding to the number of lower exhaust holes 2764.

The upper exhaust line 2761 and the lower exhaust line 2763 may be joined. Exhaust inside the upper exhaust line 2761 and the lower exhaust line 2763 may be discharged to the outside through a joining line where the upper exhaust line 2761 and the lower exhaust line 2763 are joined.

The pressure reducing member 2765 may provide reduced pressure when exhausting the processing space. The pressure reducing member 2765 may be installed and provided on the joining line of the upper exhaust line 2761 and the lower exhaust line 2763. Alternatively, a plurality of pressure reducing members 2765 may be provided to be installed in each of the lower exhaust line 2763 and the upper exhaust line 2761. As an example, the pressure reducing member 2765 may be provided as a pump. Alternatively, the pressure reducing member 2765 may be provided with other types of devices known to provide reduced pressure.

The heating plate 2731 is provided with lift pins 2735 that may be driven in the vertical direction along the third direction 6. The lift pins 2735 receive the substrate W from a transport means outside the heating unit 2660 and put the received substrate W down on the heating plate 2731 or lift the substrate W from the heating plate 2731 and transfer the substrate W to the transport means outside the heating unit 2660. As an example, three lift pins 2735 may be provided.

The gas supply unit 2750 may supply a processing gas to the substrate W located in the processing space. The processing gas may include a gas for adhesion. As an example, the processing gas may include hexamethyldisilane (HMDS). The processing gas may change the properties of the substrate W from hydrophilic to hydrophobic. In addition, the processing gas may be provided in a mixture with a carrier gas. At this time, the carrier gas may be provided as an inert gas. As an example, the inert gas may be nitrogen gas.

The gas supply unit 2750 may include a gas supply nozzle 2751, a gas supply line 2752, a storage tank 2754, and a vaporization means 2800. The gas supply nozzle 2751 may be connected to the central region of the upper chamber 2711. The gas supply nozzle 2751 may supply the processing gas delivered through the gas supply line 2752 to the substrate W. A supply position of the processing gas supplied by the gas supply nozzle 2751 may be located opposite to the central upper region of the substrate W.

The gas supply line 2752 may be connected to the storage tank 2754. The gas supply line 2752 may deliver the processing gas generated in the storage tank 2754 to the gas supply nozzle 2751. Although not shown in detail, a valve may be installed on the gas supply line 2752. The valve installed on the gas supply line 2752 may be an on/off valve or a flow control valve. A sensor part 2755 for detecting a flow of processing gas supplied to the processing space may be installed on the gas supply line 2752. The sensor part 2755 may include a concentration measuring member, a flow sensor, and the like.

The storage tank 2754 may have an internal space in which processing fluid in a liquid state is stored. At this time, the processing fluid in a liquid state may be HMDS in a liquid state. As an example, may be provided in a substantially cylindrical shape with a predetermined space therein. That is, a bottom surface and a side wall provided in a vertical direction from the edge of the bottom surface may be provided. Optionally, a cover (not shown) may be further provided on the top of the storage tank 2754, thereby sealing the inside of the storage tank 2754. A processing fluid supply line 2812 for supplying the processing fluid in a liquid state to the storage tank 2754 and a carrier gas supply line 2814 for supplying carrier gas may be connected to the storage tank 2754.

The storage tank 2754 may store the processing fluid supplied through the processing fluid supply line 2812 and store a mixed gas of the carrier gas supplied through the carrier gas supply line 2814 and the processing fluid vaporized by the carrier gas. That is, in the storage tank 2754, the processing fluid in a liquid state may be stored from the bottom surface thereof to a predetermined height, and the mixed gas of the carrier gas and vaporized processing fluid gas may exist in the remaining space above the surface of the processing fluid in a liquid state.

Referring to FIGS. 8 and 9, in the storage tank 2754, a vaporization means 2800 for vaporizing the liquid processing fluid may be provided. The vaporization means 2800 according to the present disclosure may include: a bubbler 2820 that vaporizes the liquid processing fluid in a bubbling manner using a carrier gas supplied to a storage space; a blower 2830 that vaporizes the liquid processing fluid in a blowing manner using the carrier gas supplied to the storage space; and exhaust ports 2822 and 2832 for discharging the processing gas vaporized by the bubbler 2820 or the blower 2830, that is, the gaseous processing fluid to the gas supply line 2752.

The bubbler 2820 is disposed to be immersed within the liquid processing fluid in the storage tank 2754 while the blower 2830 is disposed above the surface of the liquid processing fluid in the storage tank 2754, and the liquid processing fluid may be vaporized by supplying the carrier gas supplied through the carrier gas supply line 2814 toward the liquid processing fluid. The bubbling vaporization method by the bubbler 2820 provided in a state submerged in the liquid processing fluid has a relatively higher vaporization rate than the blowing vaporization method by the blower 2830 that supplies the carrier gas to the surface of the liquid processing fluid, but is less secure. In other words, the blowing vaporization method by the blower 2830 has a relatively lower vaporization rate than the bubbling vaporization method by the bubbler 2820, but is more secure.

As shown in FIG. 8, the blower 2830 may be provided in a form surrounding a pipe through which the carrier gas is supplied to supply the carrier gas toward the surface of the liquid processing fluid. For example, the blower 2830 may be provided in the form of an air knife that is installed in a ring shape along the circumference of a plate larger than the circumference of the pipe to spray carrier gas, and may form an air curtain surrounding the pipe.

Due to its upper shape in the form of enclosing the pipe, the blower 2830 provided above the bubbler 2820 may prevent liquid splashing that may occur when bubbles generated by the bubbler 2820 burst. That is, the blower 2830 provided together with the bubbler 2820 may prevent liquid processing fluid from leaking out of the storage tank 2754 by serving as a shield to prevent liquid splashing. As an example, the liquid processing fluid may be prevented from flowing into the exhaust ports 2822 and 2832.

The exhaust ports 2822 and 2832 respectively connected to the bubbler 2820 and the blower 2830 may be connected to the gas supply line 2752. A mixed fluid in which the carrier gas and the vaporized processing gas are mixed may flow through the exhaust ports 2822 and 2832.

The carrier gas supply line 2814 may be provided between a carrier gas supply source and the storage tank 2754 to supply carrier gas from the carrier gas supply source to the storage tank 2754. The carrier gas is a gas for vaporizing the liquid processing fluid stored in the storage tank 2754 and transporting the liquid processing fluid to the gas supply line 2852, and may include, for example, nitrogen gas. The carrier gas supply line 2814 is branched into a first branch line 2816 and a second branch line 2818, and a valve 2815 may be provided at the branch point. The valve 2815 may be provided as a 3-way-valve to control the flow direction of the carrier gas. The first branch line 2816 may be connected to the bubbler 2820 and the second branch line 2818 may be connected to the blower 2830.

Meanwhile, the gas supply unit 2750 according to an embodiment of the present disclosure may further include a controller 2860. The controller 2860 may control the valve 2815 to select a method of vaporizing the processing fluid in a liquid state. As an example, the controller 2860 may select one of the bubbling method, the blowing method, and the mixed method as the vaporization method of the processing fluid on the basis of a user's control. For example, the controller 2860 may be configured to select a method of vaporizing the processing fluid on the basis of a recipe selected by the user. The controller 2860 may control an opening position or opening sequence of the valve 2815 to select a vaporization method.

The controller 2860 may control the flow direction of the carrier gas by controlling the opening position of the valve 2815, and using this control, may select a method of vaporizing the processing fluid in a liquid state.

As an example, when the user selects the bubbling method as a method of vaporizing the liquid processing fluid to supply the processing gas to the processing space, the controller 2860 may open an outlet of the valve 2815 toward the bubbler 2820 and close an outlet toward the blower 2830. Accordingly, the carrier gas is supplied only to the bubbler 2820 from the carrier gas supply source, and the processing fluid in a liquid state may be vaporized in a bubbling manner and supplied to the processing space through the gas supply nozzle 2751 via the exhaust port 2822 and the gas supply line 2752. At this time, the liquid splashing phenomenon accompanying the bubbling method may be prevented by the blower 2830 provided above the bubbler 2820. That is, the blower 2830 provided on the top of the bubbler 2820 may serve as a shield to prevent liquid splashing. For example, the blower 2830 may prevent liquid splashing, which may occur when bubbles generated by the bubbler 2820 burst.

On the other hand, when the user selects the blowing method as a method of vaporizing the liquid processing fluid to supply the processing gas to the processing space, the controller 2860 may open an outlet of the valve 2815 toward the blower 2830 and close an outlet toward the bubbler 2820. Accordingly, the carrier gas is supplied only to the blower 2830 from the carrier gas supply source, and the processing fluid in a liquid state may be vaporized in a blowing manner and supplied to the processing space through the gas supply nozzle 2751 via the exhaust port 2832 and the gas supply line 2752.

When vaporizing the processing fluid by the mixed method, the controller 2860 may control the sequence of performing the vaporization method by controlling the opening sequence of the valve 2815.

As an example, when vaporizing the processing fluid by the mixed method, the controller 2860 may control to use the bubbling method first and then use the blowing method. Conversely, the controller 2860 may control to use the blowing method first and then use the bubbling method.

As an example, when the user selects the mixed method as a method for vaporizing the liquid processing fluid to supply the processing gas to the processing space, the user may want to use the bubbling method with a high vaporization rate at the beginning of the process and the blowing method with high stability at the end of the process.

In this case, the controller 2860 may open the outlet of the valve 2815 toward the bubbler 2820 and close the outlet toward the blower 2830 for a predetermined time at the beginning of the process. Accordingly, the carrier gas is supplied only to the bubbler 2820 from the carrier gas supply source, and the processing fluid in a liquid state may be vaporized in a bubbling manner and supplied to the processing space. At this time, the liquid splashing phenomenon accompanying the bubbling method may be prevented by the blower 2830 provided above the bubbler 2820. That is, the blower 2830 provided on the top of the bubbler 2820 may serve as a shield to prevent liquid splashing. For example, the blower 2830 may prevent liquid splashing, which may occur when bubbles generated by the bubbler 2820 burst.

After a predetermined time has elapsed, the controller 2860 may open the outlet of the valve 2815 toward the blower 2830 and close the outlet toward the bubbler 2820. Accordingly, at the end of the process after a predetermined time, the carrier gas is supplied only to the blower 2830 from the carrier gas supply source, and the processing fluid in a liquid state may be vaporized in a blowing manner and supplied to the processing space.

On the other hand, when the user selects the mixed method as a method for vaporizing the liquid processing fluid to supply the processing gas to the processing space, the user may want to use the blowing method with high stability at the beginning of the process and the bubbling method with a high vaporization rate at the end of the process.

In this case, the controller 2860 may open the outlet of the valve 2815 toward the blower 2830 and close the outlet toward the bubbler 2820 for a predetermined time at the beginning of the process. Accordingly, the carrier gas is supplied only to the blower 2830 from the carrier gas supply source, and the processing fluid in a liquid state may be vaporized in a bubbling manner and supplied to the processing space.

After a predetermined time has elapsed, the controller 2860 may open the outlet of the valve 2815 toward the bubbler 2820 and close the outlet toward the blower 2830.

Accordingly, at the end of the process after a predetermined time, the carrier gas is supplied only to the bubbler 2820 from the carrier gas supply source, and the processing fluid in a liquid state may be vaporized in a blowing manner and supplied to the processing space. At this time, the liquid splashing phenomenon accompanying the bubbling method may be prevented by the blower 2830 provided above the bubbler 2820. That is, the blower 2830 provided on the top of the bubbler 2820 may serve as a shield to prevent liquid splashing. For example, the blower 2830 may prevent liquid splashing, which may occur when bubbles generated by the bubbler 2820 burst.

Meanwhile, when vaporizing the processing fluid by the mixed method, the controller 2860 may control to use the bubbling method and the blowing method at the same time by opening all the inlets of the valve 2815 so that the carrier gas may be simultaneously supplied to the bubbler 2820 and the blower 2830. In addition, the controller 2860 may be configured to control not only the vaporization method but also the supply and concentration of the processing gas.

A substrate processing method using the substrate processing apparatus according to the embodiment of the present disclosure described above will be described with reference to FIGS. 10 and 11.

Figure 10:
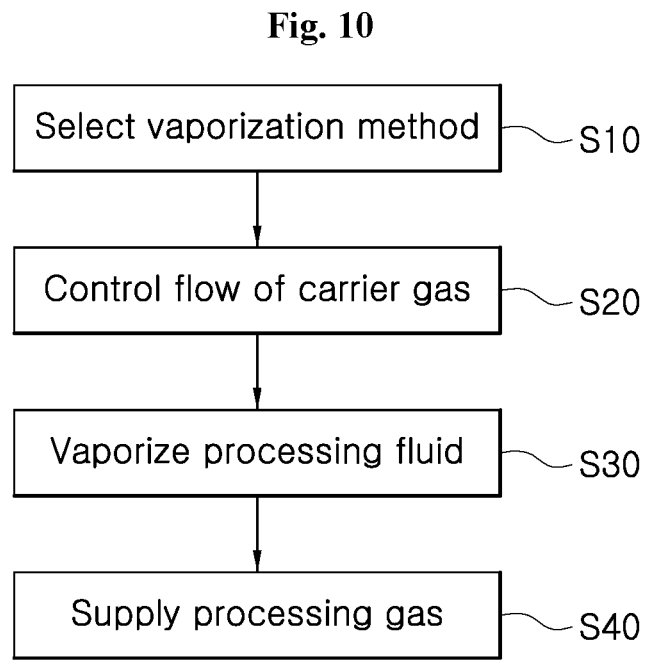
Figure 11:
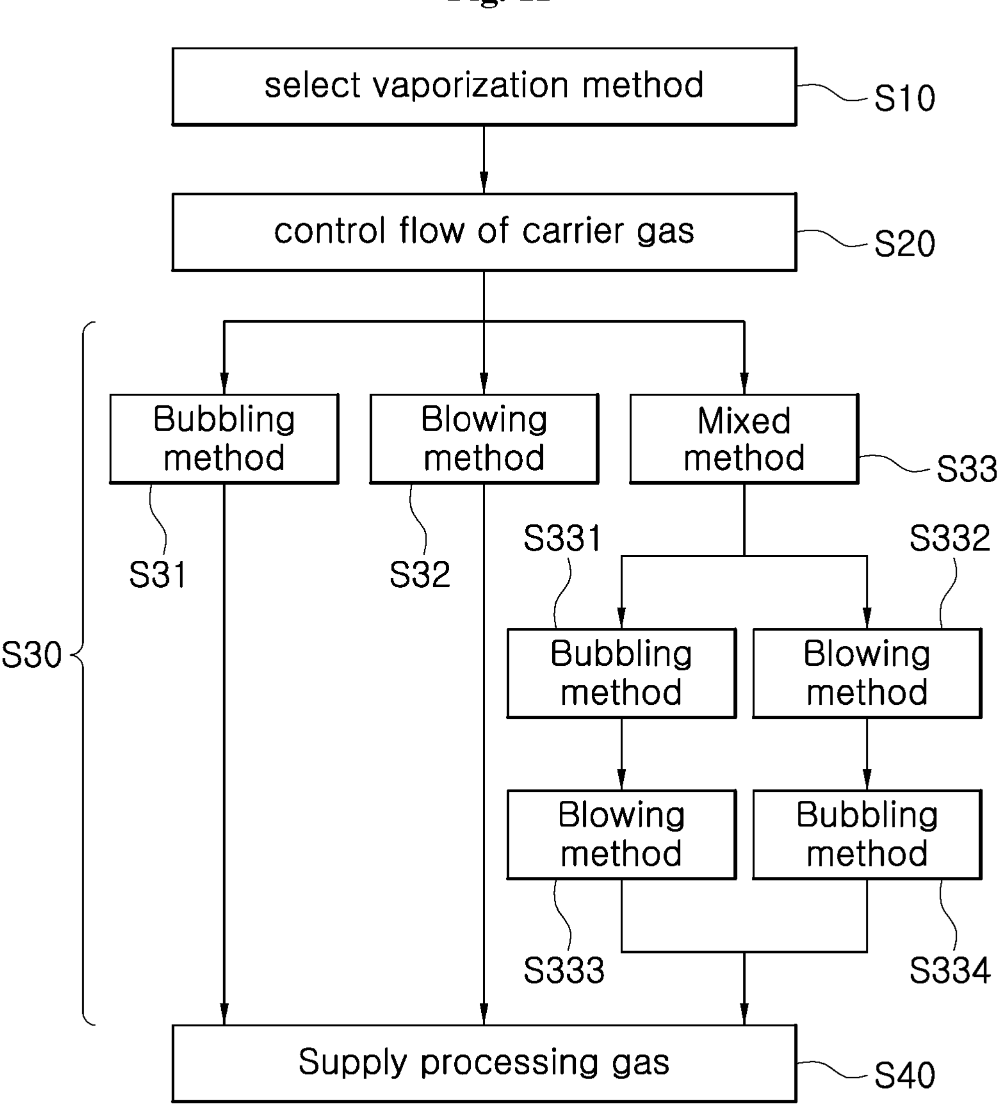

FIGS. 10 and 11 are flowcharts showing a substrate processing method according to an embodiment of the present disclosure.

A substrate processing method according to an embodiment of the present disclosure is a method of supplying a processing gas to a substrate W to improve the adhesion of a photoresist before applying the photoresist to the substrate W. The method is characterized in that at least one of a bubbling method and a blowing method may be selectively used to vaporize a processing fluid in a liquid state into a processing gas since the gas supply unit 2750 for supplying the processing gas is configured to include both a bubbler and a blower.

Referring to FIGS. 10 and 11, the substrate processing method according to the embodiment of the present disclosure may include selecting a vaporization method (S10), controlling a carrier gas flow (S20), vaporizing a processing fluid (S30), and supplying a processing gas (S40).

Selecting a vaporization method (S10) is a step of selecting a method for vaporizing a processing fluid in a liquid state into a processing gas, which may be performed by a user. Depending on the user's selection, the gas supply unit 2750 may selectively use one of the bubbling method and the blowing method, or may use a combination of the bubbling method and the blowing method.

Controlling a carrier gas flow (S20) is a step in which the controller 2860 of the gas supply unit 2750 controls the flow of carrier gas from the carrier gas supply source on the basis of the user's selection, and may be performed on the basis of step S10. Due to the step of controlling a carrier gas flow (S20), a difference may occur in the process of performing the step of vaporizing a processing fluid (S30) thereafter.

As an example, when the bubbling method is selected in step S10, the controller 2860 may control the carrier gas from the carrier gas supply source to flow only toward the bubbler 2820 (S20) by opening the outlet of valve 2815 to the bubbler 2820 and closing the outlet to the blower 2830. Accordingly, the processing fluid in a liquid state may be vaporized only by the bubbling method with a high vaporization rate (S31). At this time, the liquid splashing phenomenon accompanying the bubbling method may be prevented by the blower 2830 provided above the bubbler 2820. That is, the blower 2830 provided on the top of the bubbler 2820 may serve as a shield to prevent liquid splashing. For example, the blower 2830 may prevent liquid splashing, which may occur when bubbles generated by the bubbler 2820 burst.

On the other hand, when the blowing method is selected in step S10, the controller 2860 may control the carrier gas from the carrier gas supply source to flow only toward the blower 2830 (S20) by opening the outlet of valve 2815 to the blower 2830 and closing the outlet to the bubbler 2820. Accordingly, the processing fluid in a liquid state may be vaporized only by the blowing method with high stability (S32).

Meanwhile, when the mixed method is selected in step S10, the controller 2860 may control the flow of the carrier gas by controlling the opening sequence of the valve 2815 to control the sequence of performing the vaporization method (S33).

As an example, when the user wants to perform the bubbling method initially and the blowing method later, the controller 2860 may open the outlet of the valve 2815 toward the bubbler 2820 and close the outlet toward the blower 2830 for a predetermined time at the beginning of the process. Accordingly, the flow of the carrier gas from the carrier gas supply source flows only toward the bubbler 2820, and the processing fluid in a liquid state may be vaporized by the bubbling method with a high vaporization rate (S331). After a predetermined time has elapsed, the controller 2860 may open the outlet of the valve 2815 toward the blower 2830 and close the outlet toward the bubbler 2820. Accordingly, at the end of the process after a predetermined time, the flow of carrier gas from the carrier gas supply source flows only toward the blower 2830, and the processing fluid in a liquid state may be vaporized by the blowing method with high stability (S333).

On the other hand, when the user wants to perform the blowing method initially and the bubbling method later, the controller 2860 may open the outlet of the valve 2815 toward the blower 2830 and close the outlet toward the bubbler 2820 for a predetermined time at the beginning of the process. Accordingly, the flow of the carrier gas from the carrier gas supply source flows only toward the blower 2830, and the processing fluid in a liquid state may be vaporized by the blowing method with high stability (S332). After a predetermined time has elapsed, the controller 2860 may open the outlet of the valve 2815 toward the bubbler 2820 and close the outlet toward the blower 2830. Accordingly, at the end of the process after a predetermined time, the flow of carrier gas from the carrier gas supply source flows only toward the bubbler 2820, and the processing fluid in a liquid state may be vaporized by the bubbling method with a high vaporization rate (S334).

As described above, the step of vaporizing a processing fluid (S30) may be performed differently according to the step of selecting a vaporization method (S10) based on the user's selection. That is, the carrier gas supplied to the carrier gas supply line 2814 is supplied to at least one of the bubbler 2820 and the blower 2830 under the control of the controller 2860, and accordingly, the processing fluid in a liquid state in the storage tank 2754 may be vaporized in at least one of a bubbling method and a blowing method. The vaporized processing gas and carrier gas may be discharged to the gas supply line 2752 through the exhaust ports 2822 and 2832 and supplied to the processing space. Unlike this, a separate exhaust port is not provided, and the mixed gas of the carrier gas and the processing gas existing on the upper side of the storage tank 2754 may be configured to be supplied to the processing space through the gas supply line 2752 connected to the upper side of the storage tank 2754.

The processing gas vaporized in various ways in the step of vaporizing a processing fluid (S30) may be supplied to the processing space through the gas supply line 2752 and the gas supply nozzle 2751 (S40).

The above detailed description is illustrative of the present disclosure. In addition, the foregoing is intended to illustrate and describe preferred embodiments of the present disclosure, and the present disclosure may be used in many different combinations, modifications and environments. That is, changes or modifications are possible within the scope of the concept of the invention disclosed in this specification, within the scope equivalent to the written disclosure and/or within the scope of skill or knowledge in the art. The written embodiments describe the best state for implementing the technical idea of the present disclosure, and various changes required in the specific application field and required for the specific use of the present disclosure are also possible. Therefore, the above detailed description of the invention is not intended to limit the present disclosure to the disclosed embodiments. Furthermore, the appended claims should be construed to cover other embodiments as well.

What is claimed is:

1. A substrate processing apparatus, comprising:

a process chamber configured to have a processing space therein;

a support unit configured to support a substrate within the processing space;

a gas supply unit configured to supply a processing gas to the processing space; and an exhaust unit configured to evacuate the processing space, wherein the gas supply unit is configured to vaporize a processing fluid in a liquid state to the processing gas and supplies the processing gas to the processing space, wherein the gas supply unit comprises:

a gas supply line for supplying the processing gas to the processing space;

a storage tank having a storage space in which the processing fluid in the liquid state is stored; and a vaporization means for vaporizing the processing fluid in the liquid state in the storage space using a carrier gas, and wherein the vaporization means comprises:

a bubbler disposed to be immersed in the liquid processing fluid in the storage tank to vaporize the processing fluid in a bubbling manner using the carrier gas, the bubbler connected to a pipe through which the carrier gas is supplied; and a blower disposed above a surface of the liquid processing fluid in the storage tank, the blower provided in a form surrounding the pipe and configured to vaporize the processing fluid in a blowing manner using the carrier gas.

2. The substrate processing apparatus of claim 1, wherein the vaporization means receives the carrier gas through a carrier gas supply line, and wherein on the carrier gas supply line, a three-way valve for controlling a flow direction of the carrier gas is provided.

3. The substrate processing apparatus of claim 2, wherein the gas supply unit further comprises:

a controller for controlling the three-way valve to select a vaporization method of the processing fluid.

4. The substrate processing apparatus of claim 3, wherein the controller selects one of a bubbling method, a blowing method, and a mixed method thereof as the vaporization method of the processing fluid on the basis of a user's selection.

5. The substrate processing apparatus of claim 4, wherein when the controller selects the mixed method, the gas supply unit is controlled to vaporize and supply the processing fluid vaporized by the bubbling method for a predetermined time to the processing space and then supply the processing fluid vaporized by the blowing method.

6. The substrate processing apparatus of claim 4, wherein when the controller selects the mixed method, the gas supply unit is controlled to vaporize and supply the processing fluid vaporized by the blowing method for a predetermined time to the processing space and then supply the processing fluid vaporized by the bubbling method.

7. The substrate processing apparatus of claim 1, wherein the blower serves as a shield to prevent splashing of the processing fluid by the bubbler.

8. The substrate processing apparatus of claim 1, wherein the processing fluid is hexamethyldisilazane (HMDS).

9. The substrate processing apparatus of claim 1, wherein the gas supply unit is configured to vaporize the processing fluid in the liquid state such that the processing gas supplied to the processing space includes vaporized processing fluid carried by the carrier gas.

10. Substrate processing equipment, comprising:

an index module where a substrate flows in or out; and a treating module configured to include a substrate processing apparatus performing a thermal process on the substrate, wherein the substrate processing apparatus comprises:

a process chamber configured to have a processing space therein;

a support unit configured to support the substrate within the processing space and to include a heating member;

a gas supply unit configured to supply a processing gas to the processing space; and an exhaust unit configured to evacuate the processing space, wherein the gas supply unit is configured to vaporize a processing fluid in a liquid state to the processing gas and supplies the processing gas to the processing space, wherein the gas supply unit comprises:

a gas supply line for supplying the processing gas to the processing space;

a storage tank having a storage space in which the processing fluid in the liquid state is stored; and a vaporization means for vaporizing the processing fluid in the liquid state in the storage space using a carrier gas, and wherein the vaporization means comprises:

a bubbler disposed to be immersed in the liquid processing fluid in the storage tank to vaporize the processing fluid in a bubbling manner using the carrier gas, the bubbler connected to a pipe through which the carrier gas is supplied; and a blower disposed above a surface of the liquid processing fluid in the storage tank, the blower provided in a form surrounding the pipe and configured to vaporize the processing fluid in a blowing manner using the carrier gas.

11. The substrate processing equipment of claim 10, wherein the vaporization means receives the carrier gas through a carrier gas supply line, wherein on the carrier gas supply line, a three-way valve for controlling a flow direction of the carrier gas is provided, and the gas supply unit further comprises a controller that controls the three-way valve to select one of a bubbling method, a blowing method, and a mixed method thereof as a vaporization method of the processing fluid on the basis of a user's selection.

12. The substrate processing equipment of claim 11, wherein when the controller selects the mixed method, the gas supply unit is controlled to vaporize and supply the processing fluid vaporized by the bubbling method for a predetermined time to the processing space and then supply the processing fluid vaporized by the blowing method.

13. The substrate processing equipment of claim 11, wherein when the controller selects the mixed method, the gas supply unit is controlled to vaporize and supply the processing fluid vaporized by the blowing method for a predetermined time to the processing space and then supply the processing fluid vaporized by the bubbling method.

* * * * *